United States Patent

Bae

[11] Patent Number: 5,834,161
[45] Date of Patent: Nov. 10, 1998

[54] METHOD FOR FABRICATING WORD LINES OF A SEMICONDUCTOR DEVICE

[75] Inventor: Sang Man Bae, Ichon, Rep. of Korea

[73] Assignee: Hyundai Electronics Industries Co., Ltd., Ichon, Rep. of Korea

[21] Appl. No.: 715,631

[22] Filed: Sep. 18, 1996

[30] Foreign Application Priority Data

Sep. 18, 1995 [KR] Rep. of Korea ............... 95-30480
Oct. 25, 1995 [KR] Rep. of Korea ............... 95-37052

[51] Int. Cl.$^6$ ........................................ G03F 7/00
[52] U.S. Cl. .................. 430/313; 430/318; 438/262
[58] Field of Search ............................ 430/311, 313, 430/318; 438/261, 262, 593

[56] References Cited

U.S. PATENT DOCUMENTS 5,065,215  11/1991  Kubota ..................................... 357/45
5,464,999  11/1995  Bergemont ............................... 257/322
5,566,106  10/1996  Bergemont ............................ 365/185.33

Primary Examiner—Kathleen Duda
Attorney, Agent, or Firm—Thelen Reid & Priest LLP

[57] ABSTRACT

A method for fabricating word lines of a semiconductor device, advantageous in that the word lines are easy to form, the process allowance for the neighboring patterns is sufficiently secured and thereby enhances the process yield and reliability of device operation. In an asymmetric memory unit cell structure having a T- or Z-shaped active region, the distortion of the word lines, attributable to the diffused reflection occurring at the boundary of an element isolation oxide film, is compensated by shifting the opposite word lines up and/or down a distance as long as the distortion is caused by the diffused reflection at the slant part of an active region. As a result, the center of the word line coincides with that of contact.

6 Claims, 5 Drawing Sheets

METHOD FOR FABRICATING WORD LINES OF A SEMICONDUCTOR DEVICE

BACKGROUND OF THE INVENTION

1. Field of the invention

The present invention relates, in general, to a method for fabricating word lines of a semiconductor device and, more particularly, to a method for fabricating word lines of a semiconductor device whereby the distortion of the word lines attributed to the diffused reflection at a step of an element isolation oxide film upon exposure to light, can be compensated and thus, process allowance for other patterns can be sufficiently secured.

2. Description of the Prior Art

In general, higher integration of a semiconductor device requires a finer pattern. Such a fine pattern is largely dependent on the formation of the photosensitive film patterns which will act as a mask. Moreover, when photosensitive film patterns ar formed, they cannot be reduced to a certain degree of fineness owing to various limiting factors including the fidelity of exposure machine and the wavelength of light. For example, in the stepers employing g-line (wavelength 436 nm), i-line (wavelength 365 nm) and excimer laser (wavelength 248) as light sources, their process resolutions are limited to 0.6 $\mu$m, 0.3 $\mu$m and 0.2 $\mu$m, respectively, when forming line/space. In the case of contact holes, worse resolutions result.

For the 64 M DRAM or more scale memory devices whose unit cell consists of a capacitor storing electric charge and a transistor, patterns as fine as or finer than 0.40 $\mu$m are necessary. In fact, when the fine patterns of a highly integrated semiconductor device are formed on a wafer, if the cells are more highly integrated, more frequently than not, the patterns modeled on an exposure mask do not appear.

In order to better understand the background of the present invention, a description will be given of a conventional fabricating method of a semiconductor device in conjunction with some figures illustrating an asymmetric cell carrying a T-shaped active region.

First, a semiconductor device is designed to have T-shaped active regions 2 on a semiconductor substrate 1, two word lines 3 per an active region, each passing through the wing regions of the T-shaped active region, and a bit line contact 4 at the center of the active region 2 between the word lines 3, as shown in FIG. 1.

Referring to FIG. 2, there is a layout showing the patterns formed according to the design of FIG. 1.

Next, FIG. 3 is a cross sectional view, taken through line I—I of FIG. 2, which illustrates the fabricating processes of the semiconductor device designed.

As shown in this figure, an element isolation oxide film 5 is formed on the semiconductor substrate 1, to define the T-shaped active region 2, followed by the formation of a gate oxide film 6 on the active region 2. Over the whole surface of the resulting structure, a polysilicon layer 7, which is later processed into the word lines 3, and a photosensitive film 8 are deposited sequentially. Using a light exposure mask 10 in which light screen patterns 12 are formed at the positions corresponding to the word lines 3 to be formed, photosensitive film patterns 8 are obtained from the photosensitive film and then, serve as a mask for etching the polysilicon layer 7 into the word lines 3.

Since the formation of the element isolation oxide film 5 is accompanied with a step based on the semiconductor substrate, diffused reflection occurs at the slant part of the step of the element isolation oxide film 5 upon light exposure. Owing to the diffused reflection, the photosensitive film 8 opposed to the slant part S is exposed to light, which results in a pattern smaller than the light screen 12 by d1.

Therefore, the word line 3 which is located opposite a boundary S on the basis of the central protruded portion for the bit line contact 4 of the T-shaped active region, is overetched by notching, so that the curved portions of the word line 3 are shifted a distance of d1 upward, that is, toward the active region 2.

In summary, according to the conventional fabricating method of the word lines of a semiconductor device, such as that above-illustrated, since the word lines are designed to be symmetrical in the T-shaped active region with the bit line contact in the center, notching is generated by the light diffusively reflected at the boundary of the element isolation oxide film defining the active region.

However, the notching makes the element isolation oxide film biased toward the active region opposing to the boundary of the element isolation oxide film, reducing the allowance for subsequent processes including, for example, the formation of bit line contact or charge storage electrode contact. As a result, the process yield and the reliability of device operation deteriorate.

Referring to FIG. 4, a design layout of a semiconductor device showing an asymmetric cell having a Z-shaped active region is illustrated in accordance with another conventional technique. FIGS. 5 and 6 illustrate a conventional method for fabricating the word lines of the semiconductor device of FIG. 4. In connection with these figures, the method will be described below.

As shown in FIG. 6, the formation of an element isolation oxide film 5 produces a step against an active region 2. Upon being exposed to light, the slant part S of the step causes diffused reflection, which, then, subjects an opposing photosensitive film pattern 8 to illumination. As a result, the pattern is smaller than the desired by d1. Therefore, as shown in FIG. 5, each of word lines 3 which is opposite the slant part S of the corresponding step on the basis of the central part of a bit line contact in the Z-shaped active region 2, is over-etched, which results in the curved parts of the word lines being asymmetrically distorted.

In summary, being baffled in symmetrically designing word lines on the basis of the bit line contact in the Z-shaped active region in which the word lines opposing the boundary of the element isolation oxide film are obliquely arranged, such conventional techniques result in the formation of asymmetrical word lines because the notching occurs by the light diffusively reflected at the boundary of the element isolation oxide film defining the active region. The formation of such asymmetric word lines deprives process allowance of subsequent processes for, for example, bit line contact or charge storage electrode contact and thereby, causes the process yield and the reliability of device operation to deteriorate.

SUMMARY OF THE INVENTION

Therefore, it is an objective of the present invention to overcome the above problems encountered in prior arts and to provide a method for fabricating word lines of a semiconductor device whereby the distortion of the word lines attributed to the diffused reflection at a step of the element isolation oxide film upon exposure to light, can be compensated and thus, the allowance for subsequent processes can be sufficiently secured.

Based on the intensive and thorough research of the present inventors, the above objective may be accomplished by shifting the light screen patterns of a light exposure mask a predetermined distance on design draw, so as to form symmetrical word lines in practice.

In accordance with an aspect of the present invention, a method for fabricating word lines of a semiconductor device comprises the steps of: forming an element isolation oxide film on a semiconductor substrate, to define a T-shaped active region; forming a gate oxide film on the active region; forming a conductive layer for word line over the whole surface of the resulting structure; forming a photosensitive film on the conductive layer; selectively exposing the photosensitive film to light, to form a light exposure mask which has two light screen patterns at the areas corresponding to those to be word lines in the conductive layer, said light screen patterns each passing through the horizontal areas of the T-shaped active region, having symmetrical curved parts to each other with the vertically protruded part of the T-shaped active region in the center and being shifted a predetermined distance toward a slant part of the element isolation oxide film of the protruded active region on the basis of the word lines to be formed, said slant part causing notching upon exposure to light; developing the exposed photosensitive film, to form photosensitive film patterns; and etching the conductive layer to form two symmetrical word lines with the protruded part of the active region in the center, said photosensitive film patterns serving as a mask.

In accordance with another aspect of the present invention, a method for fabricating word lines of a semiconductor device comprises the steps of: forming an element isolation oxide film on a semiconductor substrate, to define an oblique active region; forming a gate oxide film on the active region; forming a conductive layer for word line over the whole surface of the resulting structure; forming a photosensitive film on the conductive layer; selectively exposing the photosensitive film to light, to form a light exposure mask which has two light screen patterns at the areas corresponding to those to be word lines in the conductive layer, said two light screen patterns each having curved parts asymmetrical to each other with the active region in the center, one of said two light screens overlapping with an upper part of the oblique active region and being shifted downward the center of the active region on the basis of the word lines to be formed, the other light screen overlapping with a lower part of the oblique active region and being shifted upward the center of the active region on the basis of the word lines to be formed; developing the exposed photosensitive film, to form photosensitive film patterns symmetrical to each other with the central part of the active region in the center; and etching the conductive layer to form two symmetrical word lines with said photosensitive film patterns serving as a mask.

BRIEF DESCRIPTION OF THE DRAWINGS

The above and other objectives and aspects of the invention will become apparent from the following description of embodiments with reference to the accompanying drawings in which.

DETAILED DESCRIPTION OF THE PREFERRED EMBODIMENTS

Figure 1:
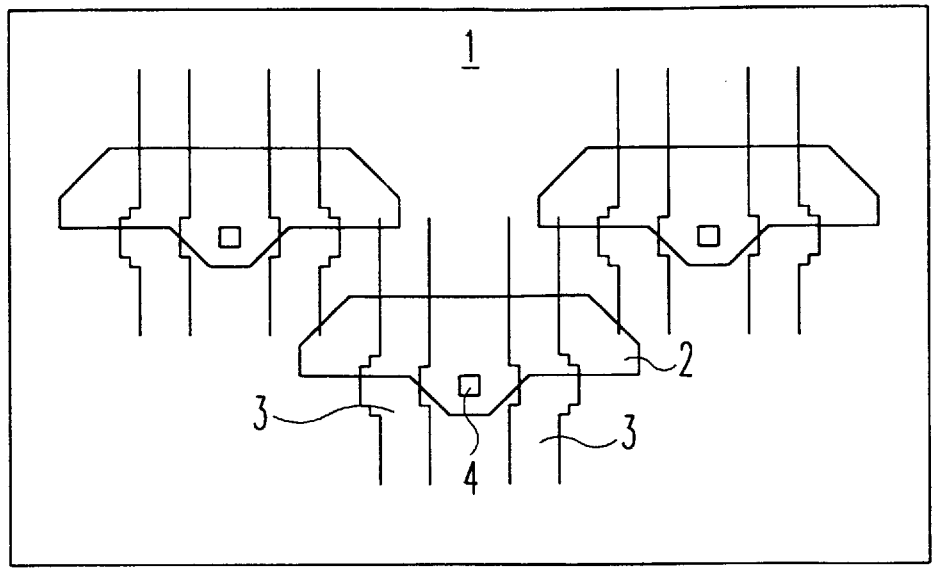
FIG. 1 is a layout for designing a semiconductor device according to a conventional technique.
Figure 2:
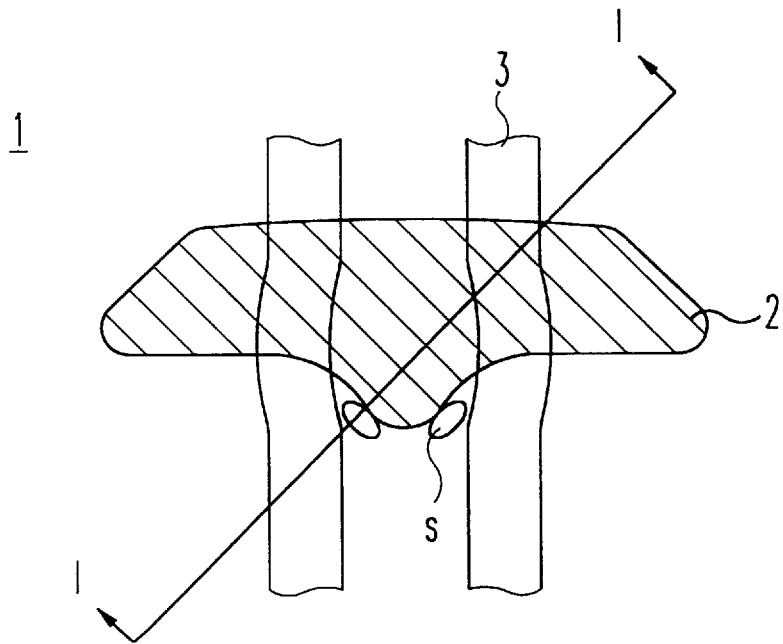
FIG. 2 is a layout showing the semiconductor device fabricated using the design of FIG. 1.

The application of the preferred embodiments of the invention is best understood with reference to the accompanying drawings, wherein like reference numerals are used for like and corresponding parts, respectively.

Figure 7:
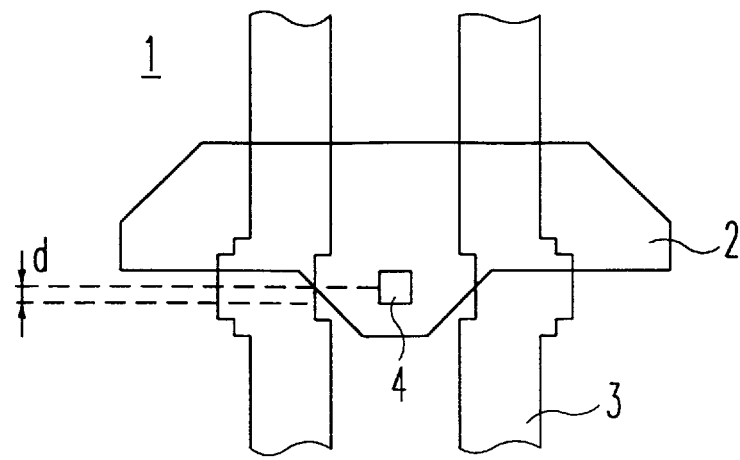
FIG. 7 is a layout for designing a semiconductor device according to a first embodiment of the present invention.
Figure 8:
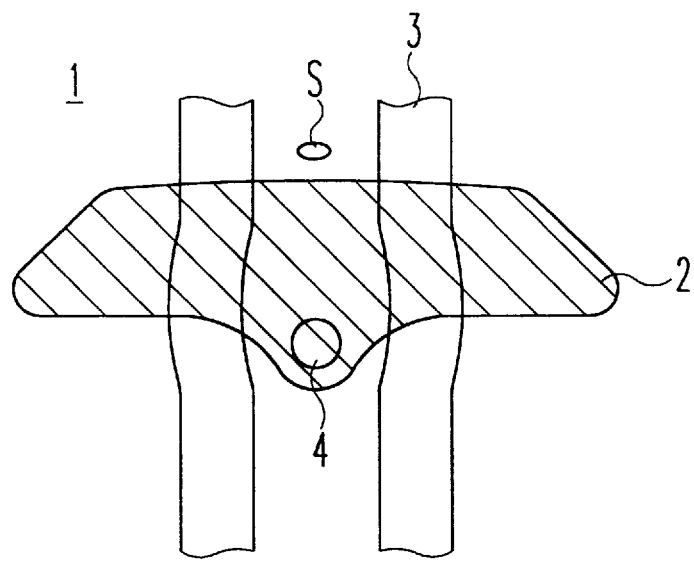
FIG. 8 is a view illustrating a fabricating method of the semiconductor device using the design of FIG. 7.

Referring to FIGS. 7 and 8, a method for forming word lines of a semiconductor device having a T-shaped active region and the formation of related patterns is illustrated in accordance with a first embodiment of the present invention.

As shown in FIG. 7, the semiconductor device has a semiconductor substrate 1 on which two word lines 3 per a T-shaped active region 2, each passing perpendicularly through the horizontal area of the active region 2, are formed and shifted downward on the basis of a bit line contact 4 formed at the center of the active region 2.

Such design of shifting the word lines 3 infringes the design rule in that there is no space for the overlapping margin allowance between the word lines and the contact hole pattern mask on the design draw and that a short circuit may occur therebetween, thus, creating the appearance of an error in semiconductor design. In spite of such infringement, the word lines 3 are designed to be shifted downward within 10% of the design rule, by for example, about 0.01 to 0.1 μm, on the basis of the bit line contact 4. While the word lines deviate from the overlap margin range of the design rule on designing, in practice, they are normally formed with a large process margin against the bit line contact.

Figure 3:
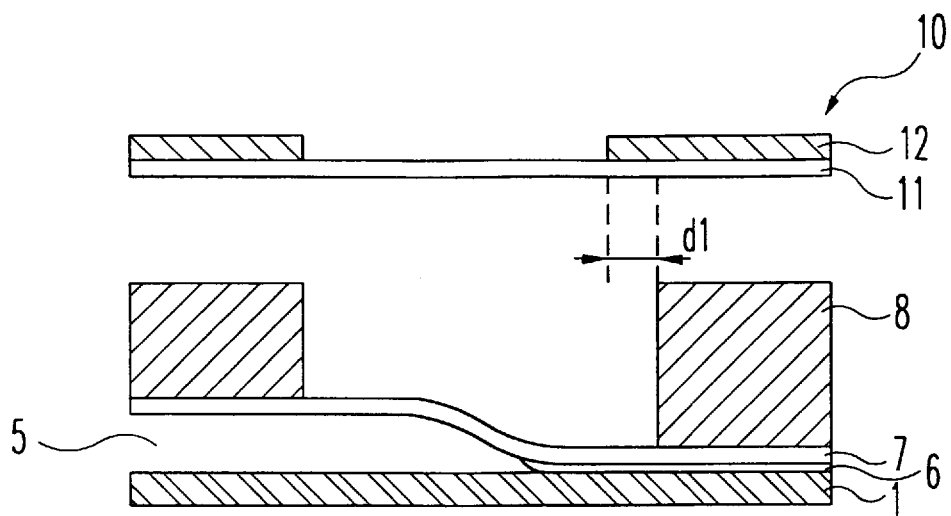
FIG. 3 is a view illustrating the processes of the conventional technique, taken along line I—I of FIG. 2.
Figure 4:
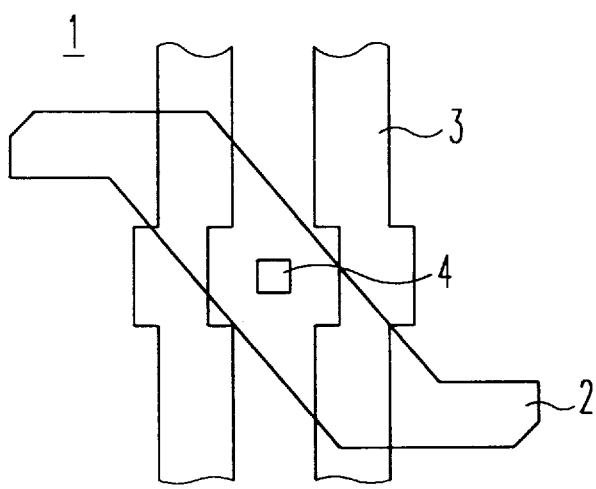
FIG. 4 is a layout for designing a semiconductor device according to another conventional technique.
Figure 5:
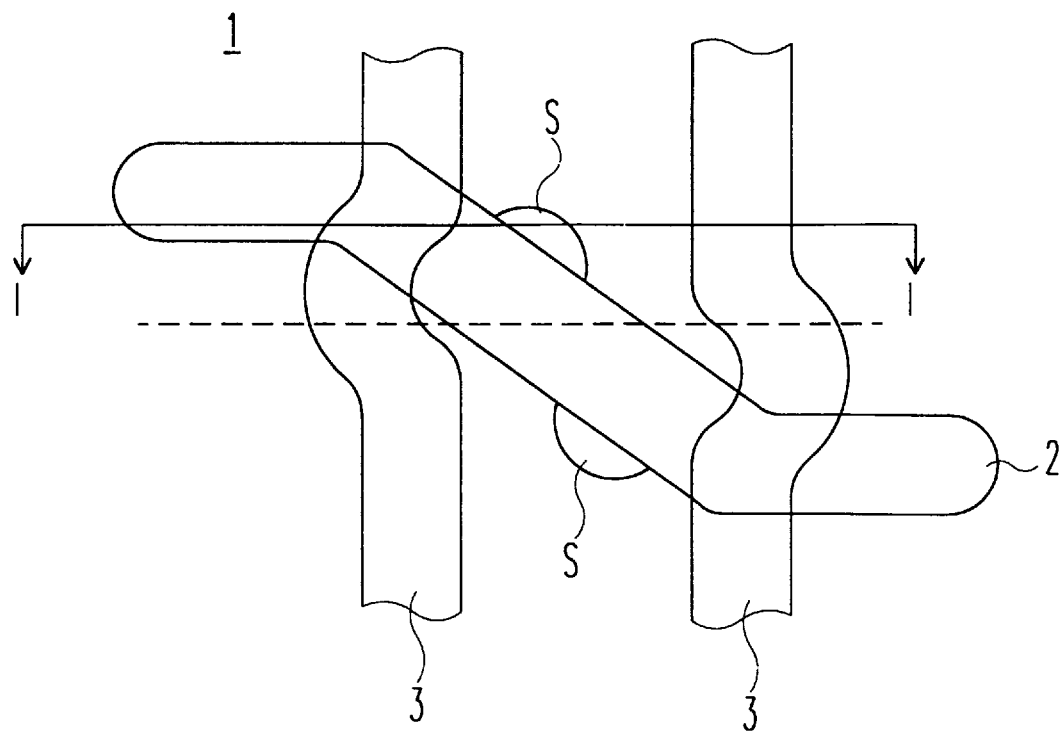
FIG. 5 is a layout showing the semiconductor device fabricated using the design of FIG. 4.
Figure 6:
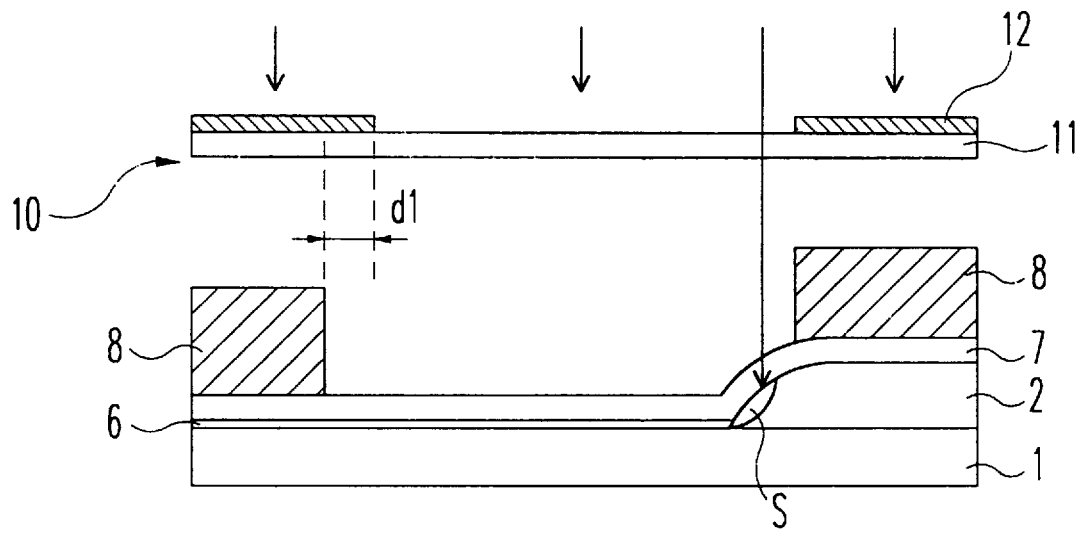
FIG. 6 is a view illustrating the processes of the conventional technique, taken along line I—I of FIG. 5.

When carrying out the design as suggested in FIG. 7, the patterns of FIG. 8 are formed. In detail, an element isolation oxide film 5 is first formed on a semiconductor substrate 1, to define an active region 2, followed by the formation of a gate oxide film 6 on the active region 2. Thereafter, over the whole surface of the resulting structure, a polysilicon layer 7 and a positive photosensitive film 8 are deposited in sequence. Using a light exposure mask 10 in which light screen patterns 12 made of Cr are formed on a transparent substrate 11 correspondingly to the word lines 3 of FIG. 3, the photosensitive film 8 is exposed to light and subjected to development, to give photosensitive film patterns 8, after which they serve as a mask for etching the polysilicon layer 7 into the word lines 3.

Diffused reflection occurs at the slant part S of the element isolation oxide film 5 upon exposure and exposes it to the light the photosensitive film 8 opposing to the slant part S. At the moment, since the word lines 3 which are located to the left and the right of the active region 2, are designed to be shifted downward a distance of d on the basis of the bit line contact 4, the masks for the word lines are formed at a position lower than that of conventional masks. This shift compensates for the over-etch attributed to the diffused reflection occurring at the slant part S, resulting in the formation of two symmetric word lines 3 to the left and right of the bit line contact 4.

Figure 9:
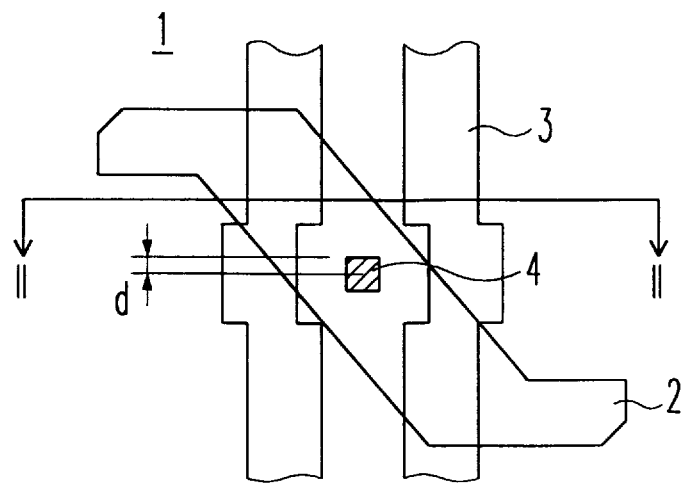
FIG. 9 is a layout of designing a semiconductor device according to a second embodiment of the present invention.
Figure 10:
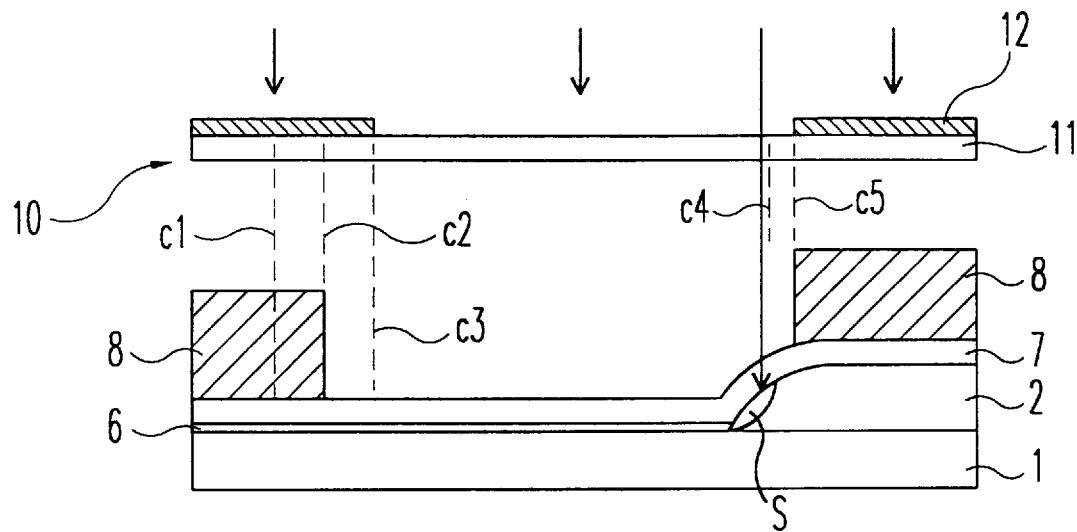
FIG. 10 is a view illustrating the fabricating processes of the semiconductor device, taken along line II—II of FIG. 9.

Turning to FIG. 9, there is a design layout of a semiconductor device according to a second embodiment of the present invention. FIG. 10 is a schematic view illustrating a fabricating method of the semiconductor device according to the layout of FIG. 9. Hereinafter, the method according to the second embodiment of the present invention will be described in connection with these figures wherein the reference numerals shows the same parts as seen in FIGS. 1 to 5.

As shown in FIG. 9, a design is executed in such a manner that a Z-shaped active region 2 might be defined on a semiconductor substrate 1 and two word lines 3 passing by the left and the right of a bit line contact 4 located at the center of the active region 2, might be shifted upward and downward, respectively.

Such design of the shifted word lines 3 may be considered as an error in semiconductor design because it seems to eliminate the overlap margin allowance between the word lines and the contact hole pattern mask on the design draw or seems to cause a short circuit between the word lines and the contact hole pattern. In spite of such infringement of the design rule, the design according to the present invention is accomplished in such a manner that the left word line may be upward shifted 0.01 to 0.1 $\mu$m and the right word line downward shifted 0.01 to 0.1 $\mu$m. The degree of such shift is within 10% of the design rule.

While such design of the word lines deviates from the overlap margin range of the design rule, normal designs are obtained on a practical wafer.

Now, let the design be carried out as suggested in FIG. 9. First, as shown in FIG. 10, an element isolation oxide 5 is formed on a semiconductor device 1, to define an active region, followed by the formation of a gate oxide film 6 on the active region 2. Thereafter, over the whole surface of the resulting structure, a polysilicon layer 7 and a positive photosensitive film 8 are deposited in sequence. Using a light exposure mask 10 in which light screen patterns 12 are formed on a transparent substrate 11 corresponding to the word lines 3 of FIG. 2, the photosensitive film 8 is exposed to light and subjected to development, to give photosensitive film patterns 8, after which they serve as a mask for etching the polysilicon layer 7 into the word lines 3.

At a slant part S of the element isolation oxide film 5, diffused reflection occurs upon exposure and exposes it to the light the photosensitive film 8 opposing the slant part S. At this moment, since the mask for the left word line 3 is designed to be larger (c3) than the conventional mask (c2), the practically formed word line 3 is formed at c2 rather than at c1 owing to the diffused reflection. In all likelihood, although the mask for the right word line 3 is designed to be larger (c4), in practice, the word line 3 is formed with a normal size (c5). Consequently, the two word lines are symmetrically formed on the basis of the bit line contact 4.

The degree of such a shift may vary with the design rules. For example, in the case of 64 M DRAM having a Z cell structure with an slant angle of 45°, the design rule is about 0.35 $\mu$m which limits the shift within a range of about 0.01 to 1 $\mu$m.

As described hereinbefore, in an asymmetric memory unit cell structure having a T- or Z-shaped active region, the distortion of the word lines, attributable to the diffused reflection occurring at the boundary of an element isolation oxide film, can be compensated by the method of the present invention. That is, the center of the word line can coincide with that of contact by shifting the opposite word lines up and/or down a distance as long as the distortion is caused by the diffused reflection. Consequently, the method of the present invention is advantageous in that the word lines are easy to form and that the process allowance for neighboring patterns is sufficiently secured, enhancing the process yield and reliability of device operation.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced in ways other than those specifically described.

What is claimed is:

1. A method for fabricating word lines of a semiconductor device, comprising the steps of:

forming an element isolation oxide film on a semiconductor substrate, to define a T-shaped active region having horizontal areas and a vertically protruded part, the element isolation oxide film having a slanted part;

forming a gate oxide film on the active region to form a resulting structure;

forming a conductive layer over the whole surface of the resulting structure;

forming a photosensitive film on the conductive layer;

selectively exposing the photosensitive film to light, to form a light exposure mask which has two light screen pattern components at areas corresponding to two respective word lines in the conductive layer, said light screen pattern components each positioned above the horizontal areas of the T-shaped active region and having curved parts that are symmetrical with respect to each other, with the vertically protruded part of the T-shaped active region in the center being located a predetermined distance with respect to the slanted part of the element isolation oxide film of the protruded part of the active region on the basis of the word lines to be formed, wherein said light exposure mask as formed compensates for notching, caused by the slanted part, of one of the light screen pattern components and resultant word lines upon exposure to light;

developing the exposed photosensitive film, to form the photosensitive film pattern components; and etching the conductive layer to form two symmetrical word lines with the protruded part of the active region in the center, said photosensitive film pattern components serving as a mask.

2. A method in accordance with claim 1, wherein:

said word lines are shifted from a bit line contact within 10% of a design rule.

3. A method in accordance with claim 2, wherein:

said word lines are shifted from a bit line contact a distance ranging from about 0.01 to 1 $\mu$m.

4. A method for fabricating word lines of a semiconductor device, comprising the steps of:

a) forming an element isolation oxide film on a semiconductor substrate, to define an oblique active region;

b) forming a gate oxide film on the active region to form a resulting structure;

c) forming a conductive layer over the whole surface of the resulting structure;

d) forming a photosensitive film on the conductive layer;
e) selectively exposing the photosensitive film to light, to form a light exposure mask which has first and second light screen pattern components at areas corresponding to two respective word lines in the conductive layer, wherein:
   1) said first and second light screen pattern components each have curved parts asymmetrical to each other about the active region;
   2) the first light screen pattern component overlaps an upper part of the oblique active region and is located down the active region on the basis of the word lines to be formed; and
   3) the second light screen pattern component overlaps a lower part of the oblique active region and is located up the active region on the basis of the word lines to be formed;
f) developing the exposed photosensitive film, to form the photosensitive film pattern components that are symmetrical to each other, with the central part of the active region in the center; and
g) etching the conductive layer to form two symmetrical word lines, with said photosensitive film pattern components serving as a mask.

5. A method in accordance with claim 4, wherein:

said word lines are shifted from a bit line contact within 10% of a design rule.

6. A method in accordance with claim 4, wherein:

said word lines are shifted from a bit line contact a distance ranging from about 0.01 to 1 $\mu$m.

* * * * *